(12) United States Patent
Faerber et al.

(10) Patent No.: US 10,077,192 B2
(45) Date of Patent: Sep. 18, 2018

(54) METHOD FOR PRODUCING POLYCRYSTALLINE SILICON

(71) Applicant: Wacker Chemie AG, Munich (DE)

(72) Inventors: Stefan Faerber, Tussling (DE);
Andreas Bergmann, Kastl (DE);
Reiner Pech, Neuoetting (DE);
Siegfried Riess, Tarsdorf (AT)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 15/113,332

(22) PCT Filed: Jan. 16, 2015

(86) PCT No.: PCT/EP2015/050769
§ 371 (c)(1),
(2) Date: Jul. 21, 2016

(87) PCT Pub. No.: WO2015/110358
PCT Pub. Date: Jul. 30, 2015

(65) Prior Publication Data
US 2017/0001868 A1    Jan. 5, 2017

(30) Foreign Application Priority Data
Jan. 22, 2014 (DE) .......... 10 2014 201 096

(51) Int. Cl.
*C01B 33/035* (2006.01)
*C30B 15/36* (2006.01)

(52) U.S. Cl.
CPC ............ *C01B 33/035* (2013.01); *C30B 15/36* (2013.01)

(58) Field of Classification Search
CPC ....... C01B 33/035; C30B 15/36; H01L 29/04; H01L 21/22; B05C 13/00; C23C 16/00
USPC .......... 264/404; 257/49; 427/248.1; 438/526
See application file for complete search history.

(56) References Cited

U.S. PATENT DOCUMENTS

| 6,033,974 A * | 3/2000 | Henley ................. B81C 1/0038 438/510 |
| 6,313,013 B1 | 11/2001 | Flottmann et al. |
| 2008/0038178 A1 | 2/2008 | Altmann et al. |
| 2011/0229658 A1 | 9/2011 | Kraus et al. |
| 2011/0274926 A1 | 11/2011 | Oda et al. |
| 2012/0175613 A1 * | 7/2012 | Netsu ................... C01B 33/037 257/49 |
| 2012/0237678 A1 * | 9/2012 | Bovo ................... C01B 33/035 427/248.1 |
| 2013/0219967 A1 | 8/2013 | Hussy et al. |
| 2014/0314654 A1 | 10/2014 | Sofin et al. |
| 2015/0003952 A1 | 1/2015 | Kurosawa et al. |

FOREIGN PATENT DOCUMENTS

| CN | 101691222 A | 4/2010 |
| CN | 101974784 A | 2/2011 |
| CN | 102121106 A | 7/2011 |
| CN | 102211773 A | 10/2011 |
| CN | 102498064 A | 6/2012 |
| CN | 202358922 U | 8/2012 |
| CN | 104010969 A | 8/2014 |
| DE | 10 2011 089 449 A1 | 6/2013 |
| EP | 0 338 682 A2 | 10/1989 |
| EP | 1 338 682 A2 | 8/2003 |
| EP | 1 886 971 A1 | 2/2008 |
| EP | 2 479 142 A1 | 7/2012 |
| JP | 2000128693 A2 | 5/2000 |
| JP | 2010180078 A2 | 8/2010 |
| JP | 2011195439 A2 | 10/2011 |
| JP | 2013023425 A2 | 2/2013 |
| JP | 2013159504 A2 | 8/2013 |
| TW | 201100597 A1 | 1/2011 |
| TW | 201131008 A1 | 9/2011 |
| TW | 201207164 A1 | 2/2012 |
| WO | 2011/033712 A1 | 3/2011 |
| WO | 2011044467 A1 | 4/2011 |

OTHER PUBLICATIONS

Ritchie, Failure of Silicon, 13th Workshop on Crystalline Solar Cell Materials and Processes, Aug. 2003.*

* cited by examiner

Primary Examiner — Matthew J Daniels
Assistant Examiner — Yunju Kim
(74) Attorney, Agent, or Firm — Brooks Kushman P.C.

(57) ABSTRACT

Production of highly pure comminuted polycrystalline silicon from polycrystalline silicon rods produced by the Siemens process is facilitated by removal of graphite residues from the electrode ends of the rods by removing the contaminated end portions by means of mechanical impulses.

19 Claims, No Drawings

METHOD FOR PRODUCING POLYCRYSTALLINE SILICON

CROSS REFERENCE TO RELATED APPLICATIONS

This application is the U.S. National Phase of PCT Appln. No. PCT/EP2015/050769 filed Jan. 16, 2015, which claims priority to German Application No. 10 2014 201 096.9 filed Jan. 22, 2014, the disclosures of which are incorporated in their entirety by reference herein.

BACKGROUND OF THE INVENTION

1. Field of the Invention

The invention provides a process for producing polycrystalline silicon.

2. Description of the Related Art

Polycrystalline silicon (polysilicon for short) serves as a starting material in the production of monocrystalline silicon by means of crucible pulling (Czochralski or "CZ" process) or by means of zone melting (float zone or "FZ" process). This monocrystalline silicon is divided into wafers and, after a multitude of mechanical, chemical and chemo-mechanical processing operations, used in the semiconductor industry for manufacture of electronic components (chips).

More particularly, however, polycrystalline silicon is required to an increased degree for production of mono- or multicrystalline silicon by means of pulling or casting processes, this mono- or multicrystalline silicon serving for manufacture of solar cells for photovoltaics.

The polycrystalline silicon is typically produced by means of the Siemens process. In this process, in a bell jar-shaped reactor ("Siemens reactor"), thin filament rods ("thin rods") of silicon are heated to surface temperatures of 900-1200° C. by direct passage of current and a reaction gas comprising a silicon-containing component, especially a halosilane, and hydrogen is introduced via injection nozzles. In the course of this, the halosilanes break down at the surface of the thin rods. This deposits elemental silicon on the thin rods from the gas phase.

The silicon rods were held in the reactor by special electrodes which generally consist of high-purity electrographite. Every two thin rods connected to the voltage with different polarity at the electrode holders are connected by a bridge at the other end of the thin rods to form a closed circuit. Through the electrodes and the electrode holders thereof, electrical energy is supplied to heat the thin rods.

During the deposition, the diameter of the thin rods grows. At the same time, the electrode, beginning at its tip, grows into the rod base of the silicon rods.

The main material used for the electrodes is graphite, since graphite is available in very high purity and is chemically inert under deposition conditions. Moreover, graphite has a very low specific electrical resistivity.

After the attainment of a desired target diameter of the silicon rods, the deposition process is ended, and the glowing silicon rods are cooled down and deinstalled.

Subsequently, the U-shaped rod pairs of polysilicon obtained are typically cut to length at the electrode and bridge ends and comminuted to chunks. The comminution is effected by means of a crusher, for example with a jaw crusher. Such a crusher is described, for example, in EP 338 682 A2. This is optionally preceded by a pre-comminution by means of a hammer.

Previously, the graphite electrode is typically removed. EP 2 479 142 A1 discloses removing at least 70 mm from the electrode end of the rod. This is said to lead to a lower concentration of extraneous substances such as chromium, Iron, nickel, copper and cobalt in the interior of the silicon chunks produced. The removal is effected by means of a cutting tool, for example by means of a rotary saw. However, a not inconsiderable amount of polycrystalline silicon is lost in this process.

However, there are also known processes in which the removed end of the rod, comprising silicon and graphite, is treated chemically by etching the graphite away or converting into a powder form which can be removed easily from the polysilicon. This gives rise to a rod piece which has been freed of graphite and can be processed further. However, there is the risk of contaminating the polycrystalline silicon in the process. Processes of this kind are described in CN 101691222 B, CN 101974784 A, CN 102121106 A and CN 102211773 A.

In CN202358922 U, an attempt is made to prevent growth of the electrode into the rod base through a suitable construction of electrode and electrode holder. This is said to lead to a higher yield of polycrystalline silicon.

The problem addressed is thus that of completely removing the electrode while achieving minimum contamination of the polycrystalline silicon. In addition, the process is to ensure high productivity and a maximum yield of polycrystalline silicon.

SUMMARY OF THE INVENTION

These and other objects are achieved by a process for producing polycrystalline silicon, comprising
a) depositing polycrystalline silicon by means of CVD on at least one U-shaped support body which is heated by direct passage of current to a temperature at which polycrystalline silicon is deposited on the support body, resulting in formation of at least one U-shaped pair of polycrystalline silicon rods, each free end of the support body being connected to a graphite electrode and being supplied with power in this way;
b) deinstalling the at least one pair of polycrystalline silicon rods from the reactor;
c) removing graphite residues from the electrode ends of the at least two polycrystalline silicon rods of the at least one pair of polycrystalline silicon rods;
d) comminuting the at least two polycrystalline silicon rods to give rod pieces or to give chunks;
wherein the step of removing graphite residues from the electrode ends comprises knocking the graphite residues off the electrode ends of each of the at least two polycrystalline silicon rods by means of at least one mechanical impulse.

DETAILED DESCRIPTION OF THE PREFERRED EMBODIMENTS

Preferred embodiments of the process can be inferred from the dependent claims.

The deposition is effected as elucidated in the description of the prior art. The rod pairs can be deinstalled by means of a crane, a grab or the like.

The silicon rods are ultimately comminuted to rod pieces or chunks.

In the comminution to give rod pieces, after removal of the graphite residues from the electrode ends of the rods, one or more rod pieces can be removed from one or both ends of the rods.

Particular preference is given to comminuting the silicon rods to chunks. The silicon rods are preferably comminuted to chunks by means of a jaw crusher or roll crusher. This is optionally preceded by a pre-comminution by means of suitable impact tools.

The graphite residues are preferably knocked off by means of an impact tool, more preferably with a hammer. The impact face of the impact tool, for example the hammer head, comprises a low-contamination cemented carbide or a low-abrasion ceramic such as tungsten carbide, titanium carbide, chromium carbide, molybdenum carbide, vanadium carbide, nickel carbide or silicon carbide.

The impact energy expended in the at least one mechanical impulse is preferably not more than 20 J, more preferably not more than 10 J. The impact energy is preferably determined by means of suitable pressure sensors. It is likewise possible to calculate the impact energy from the speed and mass of the impact tool, the final speed of the impact tool being determined, for example, by means of a camera.

After the graphite residues have been knocked off, the silicon rods preferably have surface contamination with Fe, Cr, Ni, W, Ti and Co of less than 250 pptw in total.

The surface metals are determined to ASTM F 1724-96 by chemical leaching of the silicon surface by dissolution and subsequent analysis of the leaching solution by ICPMS (inductively coupled plasma mass spectrometry).

Preferably, the mechanical impulse is exerted at a distance of not more than 50 mm from the electrode end of the silicon rod. Particular preference is given to a distance of not more than 20 mm, very particular preference to not more than 10 mm. The distance should be at least 5 mm.

The graphite residues are preferably knocked off in a cleanroom.

During the process of knocking off the graphite residues, the residual rod (distance from the electrode end greater than 50 mm if the mechanical impulse is exerted at a distance of less than 50 mm) is covered with a plastic bag. In this arrangement, particularly good results are achieved with respect to the contamination of the rods. The contamination of the silicon rods with surface metals Fe, Cr and Ni is preferably not more than 30 pptw in total, more preferably not more than 10 pptw.

Preferably, the graphite residues are knocked off by means of two mechanical impulses.

The impact energy expended in the first mechanical impulse is preferably not more than 20 J and the impact is made at a distance of not more than 30 mm from the electrode end of the silicon rod.

The impact energy expended in the second mechanical impulse is preferably not more than 10 J and the impact is made at a distance of not more than 30 mm from the electrode end of the silicon rod.

Alternatively, rather than the first mechanical impulse, several impacts can be made, each with an impact energy of about 2 J.

Alternatively, rather than the second mechanical impulse, several impacts can be made, each with an impact energy of about 1 J.

Preferably, the graphite residues are knocked off with spatial separation from the subsequent process steps, especially from the comminution of the rods to chunks. This can also be accomplished by isolating the workbench at which the graphite residues are knocked off, for example by means of suitable wall elements or curtains.

Preferably, the mechanical impulses to knock off the graphite residues are each made at an angle of less than 45° to the rod axis, with the rod axis arranged horizontally. It has been found that this enables more controlled removal of the graphite residues with low contamination. For personnel, it additionally means increased safety if the rod breaks in a defined manner.

More preferably, the rod lies on a suitable rest, with a support point at a distance of less than 500 mm, more preferably less than 300 mm, most preferably less than 100 mm, from the electrode end of the rod.

Preferably, the graphite residues are knocked off while the at least one silicon rod pair is in a deinstallation aid. A deinstallation aid comprises a body which was an outer wall and an inner wall and fully surrounds the rod pair, wherein the body along with the rod pair that it surrounds is removed from the reactor by means of a crane, a cable winch or a grab.

The dimensions of the body are preferably such that its length corresponds at least to the height of the upright rod pair. Its width is preferably at least the width of a U-shaped pair of silicon rods (silicon bridge+rod diameter). Its width is preferably at least 200 mm, more preferably at least 300 mm.

Preferably, the body has an inner wall made of steel. The inner wall of the body may be coated with a polymer. The body preferably consists of steel, i.e. has a steel jacket. Particular preference is given to a design which provides for a body with an uncoated inner steel wall, the pair of silicon rods being covered with a plastic bag during the deinstallation. As an alternative to the uncoated steel wall in combination with a plastic bag, preference is especially also given to an embodiment of the body composed of a low-contamination cemented carbide or a low-abrasion ceramic (e.g. tungsten carbide, titanium carbide, chromium carbide, vanadium carbide and nickel carbide, silicon carbide).

Preference is also given to the use of a body comprising an inner steel wall, the inner wall of the body being partly or fully coated with such a low-contamination cemented carbide or with a low-abrasion ceramic.

It is likewise preferable that the body consists of a flexible but stable plastic. Possible plastics here are fiber composite plastics, composed of an aromatic polyamide (aramid fibers) or of a polyester such as polycarbonate and polyethylene terephthalate. Equally possible are materials composed of carbon or carbon constituents or glass fiber-reinforced plastics (GRP).

The pair of silicon rods itself can be raised with the aid of a crane device, a cable winch or comparable systems.

Preferably, each body comprises a flap closable manually or by means of a mechanical or electrical mechanism in one or more openings of the body. After the rods have been lifted out of the reactor, the graphite residues can be knocked off while the rod pair is still within the body. For this purpose, the rod pair is lifted out of the deinstallation aid, for example by means of a grab, such that every rod base projects out of the opening of the deinstallation aid by less than 500 mm, more preferably less than 300 mm and most preferably less than 100 mm. In this arrangement, the graphite residues are then knocked off the rods, with at least the parts of the rods that do not project out of the deinstallation aid covered by a plastic bag.

This preferably ensures that there is no contact between the plastic bag and graphite residues. The plastic bag therefore preferably ends at a distance of at least 5 mm from the graphite residues. It is thus possible to avoid contamination of the plastic bag by the graphite residues.

Preference is given to using a cart which can be moved to the deinstallation aid. The cart is preferably configured such that it can be positioned beneath the electrode end of the rods, while the rods are still within the deinstallation aid.

The cart is preferably lined with a low-contamination material such as silicon or plastic. The cart preferably comprises a collecting box for material knocked off. Most preferably, the cart comprises a separating plate, for example a grid or a sieve, beneath the electrode end of the silicon rods. Larger lumps are collected by the separating plate, while smaller lumps fall through the separating plate and land in the collecting box. This enables visual classification of the larger lumps with respect to graphite residues present.

Preferably, after the deinstallation of the polycrystalline silicon rods from the reactor and before the comminution of the deinstalled polycrystalline silicon rods into chunks, the polycrystalline silicon in rod form is classified into at least two quality classes on the basis of at least one feature, with those at least two quality classes being sent to separate further processing steps.

The invention thus envisages undertaking a classification of the deinstalled silicon rods into at least two quality classes. This classification precedes the comminution of the rods into chunks. It preferably follows the knocking-off operation on the graphite electrode. However, it is also preferable to undertake a classification after the comminution of the rods into chunks.

The classification may be based on surface contamination volume contamination. In this context, it is possible to classify by surface contamination of the rods or chunks with metals, nonmetals or compositions, by contamination of the volume of the rods or chunks with metals, nonmetals or compositions, and by contamination of the surface of the rods or chunks with dust (e.g. silicon dust) or by combinations of these features.

The classification feature may be a visually perceptible feature.

Preference is given to classification with respect to the presence of graphite residues on the rods. Rods with graphite residues are preferably transported for further processing in a different transport unit than the rods without graphite residues. This reduces the risk of entrainment with respect to graphite residues.

It is also preferable to undertake a classification after the comminution of the rods into chunks. It is especially preferable to classify based on the distance from the electrode end of the rod. Particular preference is given to classifying chunks into at least two fractions distinguishable by such a feature. In practice, this can be accomplished by producing at least two rod pieces from one rod, one rod piece having a distance from electrode of <1000 mm and the other rod piece a distance from electrode of >1000 mm. The two rod pieces are comminuted separately, and so the chunks produced separately are likewise classified by this feature. The at least two rod pieces and the at least two fractions of chunks produced therefrom may have different contamination with extraneous substances. They can be sent to different further processing steps.

Comparative Example

In the comparative example, the process described in EP 2 479 142 A1 was effected. 70 mm were sawn off from the electrode end of the rod. Based on the complete rod pair, a yield of about 80% was found. The contamination of the sawn surface with Fe, Cr, Ni, W and Co totaled 1.3 ppm. This necessitates cleaning of the rod surface before the rod can be comminuted to chunks.

Example

In the example, the graphite residues were knocked off with the aid of the process according to the invention. In each case, a mechanical impulse was made with a hammer, with variation of the impact energy expended (10 J, 5 J, 3 J, 2 J, 1 J), and the distance from the electrode end of the rod was 50 mm in each case. Contamination with Fe, Cr, Ni, W and Co at the surface is much lower than in the comparative example. The yields increase. Cleaning of the rods is unnecessary.

Table 1 shows a summary of the results.

TABLE 1

| | Yield | Contamination at surface | Presence of graphite in comminution | Cleaning necessary? |
|---|---|---|---|---|
| Comparative example | <85% | 1.3 ppm | low | yes |
| Mechanical impulse of 10 J | >85% | 200 pptw | low | optional |
| Mechanical impulse of 5 J | >90% | 105 pptw | low | no |
| Mechanical impulse of 3 J | >95% | 81 pptw | low; with separating plate: very low | no |
| Mechanical impulse of 2 J | >98% | 56 pptw | very low; with separating plate: 0 | no |
| Mechanical impulse of 1 J | >99% | 20 pptw | 0 | no |

The invention claimed is:

1. A process for producing polycrystalline silicon, comprising:
   depositing polycrystalline silicon in a reactor by means of chemical vapor deposition on at least one U-shaped support body which is heated by direct passage of current to a temperature at which polycrystalline silicon is deposited on the support body, resulting in formation of at least one U-shaped pair of polycrystalline silicon rods, each free end of the support body being connected to a graphite electrode and being supplied with power;
   deinstalling the at least one pair of polycrystalline silicon rods from the reactor;
   removing graphite residues from the electrode ends of the at least two polycrystalline silicon rods of the at least one pair of polycrystalline silicon rods by knocking off the graphite residues from the electrode ends of each of the at least two polycrystalline rods by means of at least one mechanical impulse, and
   comminuting the at least two polycrystalline rods, wherein an impact energy expended in the at least one mechanical impulse is not more than 20 J.

2. The process of claim 1, wherein the impact energy expended in the at least one mechanical impulse is not more than 10 J.

3. The process of claim 1, wherein the at least one mechanical impulse is exerted at a distance of not more than 50 mm from each of the electrode ends of the polycrystalline silicon rods.

4. The process of claim 2, wherein the at least one mechanical impulse is exerted at a distance of not more than 50 mm from each of the electrode ends of the polycrystalline silicon rods.

5. The process of claim 1, wherein the graphite residues are knocked off by means of at least two mechanical impulses, wherein an impact energy expended in a first mechanical impulse is not more than 20 J and is made at a distance of not more than 30 mm from each of the electrode ends of the polycrystalline silicon rods.

6. The process of claim 5, wherein an impact energy expended in a second mechanical impulse is not more than 10 J and is made at a distance of not more than 30 mm from each of the electrode ends of the polycrystalline silicon rods.

7. The process of claim 4, wherein a plurality of impacts are made, at least one first impact having an impact energy of about 2 J and at least one second impact having an impact energy of about 1 J, the impact energy of the at least one second impact being lower than the impact energy of the at least one first impact.

8. The process of claim 1, wherein the mechanical impulses to knock off the graphite residues are each made at an angle of less than 45° to the rod axis of the polycrystalline silicon rods.

9. The process of claim 2, wherein the mechanical impulses to knock off the graphite residues are each made at an angle of less than 45° to the rod axis of the polycrystalline silicon rods.

10. The process of claim 3, wherein the mechanical impulses to knock off the graphite residues are each made at an angle of less than 45° to the rod axis of the polycrystalline silicon rods.

11. The process of claim 5, wherein the mechanical impulses to knock off the graphite residues are each made at an angle of less than 45° to the rod axis of the polycrystalline silicon rods.

12. The process of claim 7, wherein the mechanical impulses to knock off the graphite residues are each made at an angle of less than 45° to the rod axis of the polycrystalline silicon rods.

13. The process of claim 8, wherein the rod axis is arranged horizontally.

14. The process of claim 1, wherein at least one pair of polycrystalline silicon rods is deinstalled from the reactor by means of a body, the body having an outer wall and an inner wall and fully surrounding the pair of polycrystalline silicon rods, wherein the body and the pair of polycrystalline silicon rods the body surrounds, are removed by means of a crane, a cable winch or a grab.

15. The process of claim 14, wherein the electrode ends of the pair of polycrystalline silicon rods have no contact with the inner wall.

16. The process of claim 14, further comprising an opening in the body, wherein at least one pair of polycrystalline silicon rods projects from or is raised out of the body after removal from the reactor.

17. The process of claim 16, wherein each polycrystalline silicon rod of the pair of polycrystalline silicon rods projects out of the opening of the body for not more than 500 mm of its length, wherein the graphite residues are then removed from the electrode ends of each of the two polycrystalline silicon rods.

18. The process of claim 1, wherein the polycrystalline silicon rods are partly covered by a plastic bag during removal of the graphite residues from polycrystalline silicon rod electrode ends.

19. The process as claimed in claim 17, wherein the polycrystalline silicon rods are each covered by a plastic bag up to a distance of at least 5 mm from the electrode ends of the polycrystalline silicon rods.

* * * * *